(12) United States Patent
Van Herpen et al.

(10) Patent No.: US 9,465,306 B2
(45) Date of Patent: Oct. 11, 2016

(54) SOURCE MODULE OF AN EUV LITHOGRAPHIC APPARATUS, LITHOGRAPHIC APPARATUS, AND METHOD FOR MANUFACTURING A DEVICE

(75) Inventors: Maarten Marinus Johannes Wilhelmus Van Herpen, Heesch (NL); Wouter Anthon Soer, Nijmegen (NL); Andrei Mikhailovich Yakunin, Eindhoven (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1172 days.

(21) Appl. No.: 13/003,137

(22) PCT Filed: Jul. 13, 2009

(86) PCT No.: PCT/EP2009/058894
§ 371 (c)(1),
(2), (4) Date: Jan. 7, 2011

(87) PCT Pub. No.: WO2010/007015
PCT Pub. Date: Jan. 21, 2010

(65) Prior Publication Data
US 2011/0109892 A1    May 12, 2011

Related U.S. Application Data

(60) Provisional application No. 61/129,715, filed on Jul. 14, 2008.

(51) Int. Cl.
*G21K 5/00* (2006.01)
*G03F 7/20* (2006.01)
*H05G 2/00* (2006.01)

(52) U.S. Cl.
CPC ....... *G03F 7/70916* (2013.01); *G03F 7/70033* (2013.01); *G03F 7/70191* (2013.01); *G03F 7/70575* (2013.01); *G03F 7/70908* (2013.01); *H05G 2/003* (2013.01); *H05G 2/008* (2013.01)

(58) Field of Classification Search
USPC ...... 250/492.1, 493.1, 504 R; 355/53, 67, 69
See application file for complete search history.

(56) References Cited

U.S. PATENT DOCUMENTS 7,217,940 B2  5/2007  Partlo et al.
8,094,288 B2  1/2012  Banine et al.
(Continued)

FOREIGN PATENT DOCUMENTS

EP    1596252         11/2005
JP    2006-135286     5/2006
(Continued)

OTHER PUBLICATIONS

International Search Report as issued for PCT/EP2009/058894, dated Sep. 29, 2009.
(Continued)

*Primary Examiner* — Nicole Ippolito
(74) *Attorney, Agent, or Firm* — Pillsbury Winthrop Shaw Pittman LLP

(57) ABSTRACT

A source module for use in a lithographic apparatus is constructed to generate extreme ultra violet (EUV) and secondary radiation, and includes a buffer gas configured to cooperate with a source of the EUV radiation. The buffer gas has at least 50% transmission for the EUV radiation and at least 70% absorption for the secondary radiation.

14 Claims, 3 Drawing Sheets

(56) References Cited

U.S. PATENT DOCUMENTS

| | | | |
|---|---|---|---|
| 2004/0109151 A1* | 6/2004 | Bakker et al. | ........... 355/69 |
| 2005/0254029 A1* | 11/2005 | Banine | ........ G03F 7/70575 |
| | | | 355/53 |
| 2006/0131515 A1 | 6/2006 | Partlo et al. | |
| 2007/0012889 A1 | 1/2007 | Sogard | |
| 2007/0080307 A1 | 4/2007 | Bruijn et al. | |

FOREIGN PATENT DOCUMENTS

| | | |
|---|---|---|
| JP | 2007-129209 | 5/2007 |
| JP | 2007-298980 | 11/2007 |
| JP | 2008-027623 | 2/2008 |
| WO | 2006/134512 | 12/2006 |

OTHER PUBLICATIONS

R. De Bruijn et al., "Absorption of EUV in laser plasmas generated on xenon gas jets," Journal of Quantitative Spectroscopy and Radiative Transfer (Online), vol. 81, No. 1-4, Mar. 27, 2003, pp. 97-105.

Japanese Office Action dated Mar. 28, 2013 in corresponding Japanese Patent Application No. 2011-517886.

* cited by examiner

SOURCE MODULE OF AN EUV LITHOGRAPHIC APPARATUS, LITHOGRAPHIC APPARATUS, AND METHOD FOR MANUFACTURING A DEVICE

CROSS-REFERENCE TO RELATED APPLICATIONS

This application is the National Phase entry of PCT/EP2009/058894, filed Jul. 13, 2009, which claims the benefit of priority from US provisional application 61/129,715, which was filed on Jul. 14, 2008, and which is incorporated herein in its entirety by reference.

FIELD

The present invention relates to a source module of an EUV lithography apparatus, a lithography apparatus comprising the same and a method for manufacturing a device.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g. comprising part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include so-called steppers, in which each target portion is irradiated by exposing an entire pattern onto the target portion at one time, and so-called scanners, in which each target portion is irradiated by scanning the pattern through a radiation beam in a given direction (the "scanning"-direction) while synchronously scanning the substrate parallel or anti-parallel to this direction.

An embodiment of the lithographic apparatus constructed to generate an extreme ultra violet (EUV) light is known from United States Patent Application Publication No. 2007/0012889. In the known apparatus in order to enrich the EUV beam propagating from an EUV source towards illumination system of the lithographic apparatus a gaseous spectral purity filter comprising $ZrCl_4$ is provided. The spectral purity filter of the known lithographic apparatus may be located in a region that receives a beam of EUV-containing light from the EUV source and delivers the beam to a suitable downstream EUV optical system, wherein the beam from the source is arranged to pass through the spectral purity filter prior to entering the optical system. The $ZrCl_4$ based gaseous spectral purity filter is configured to enrich the beam in at least one EUV wavelength as the beam passes through it.

SUMMARY

The known spectral purity filter may not effectively mitigate particulate debris propagating from the EUV source into the optical system of the lithographic apparatus. The known gaseous spectral purity filter may not be able to substantially suppress wavelengths outside the EUV range, like ultra-violet light, visible light and infra-red radiation.

It is desirable to provide a source module for use in an EUV lithographic apparatus, wherein both EUV enrichment of the generated light and debris mitigation are effectively improved.

According to an aspect of the invention, a source module for use in a lithographic apparatus is provided. The source module is constructed to generate extreme ultra violet (EUV) radiation and secondary radiation. The source module includes a buffer gas configured to cooperate with a source of the EUV radiation. The buffer gas has at least 50% transmission for the EUV radiation and at least 70% absorption for the secondary radiation. The EUV radiation may be generated using a laser-produced plasma (LPP) source.

According to an aspect of the invention, there is provided a lithographic apparatus arranged to project a pattern from a patterning device onto a substrate. The lithographic apparatus includes a source module constructed to generate extreme ultra violet (EUV) radiation and secondary radiation. The source module includes a buffer gas configured to cooperate with a source of the EUV radiation. The buffer gas has at least 50% transmission for the EUV radiation and at least 70% absorption for the secondary radiation. The buffer gas may have at least 90%, or even 95% transmission for the EUV radiation. The buffer gas may have at least 90% absorption for the secondary radiation. In addition or as an alternative, the buffer gas may be cooled. In order to cool the buffer gas, the source may comprise a passive element constructed and arranged to cool the buffer gas. Also, the source may comprise a circulation unit constructed and arranged to cool the buffer gas. Preferably, the buffer gas comprises light atomic weight elements.

According to an aspect of the invention, there is provided a device manufacturing method includes projecting a patterned beam of extreme ultra violet (EUV) radiation onto a substrate. The EUV radiation, as well as secondary radiation, is generated by a source module. The source module includes a buffer gas configured to cooperate with a source of the EUV radiation. The buffer gas has at least 50% transmission for the EUV radiation and at least 70% absorption for the secondary radiation.

According to an aspect of the invention, there is provided a device manufacturing method that includes generating extreme ultraviolet radiation and secondary radiation with a radiation source, providing a buffer gas to the radiation source, the buffer gas having at least 50% transmission for the extreme ultraviolet radiation, and at least 70% absorption for the secondary radiation, and projecting a patterned beam of the extreme ultraviolet radiation onto a substrate.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
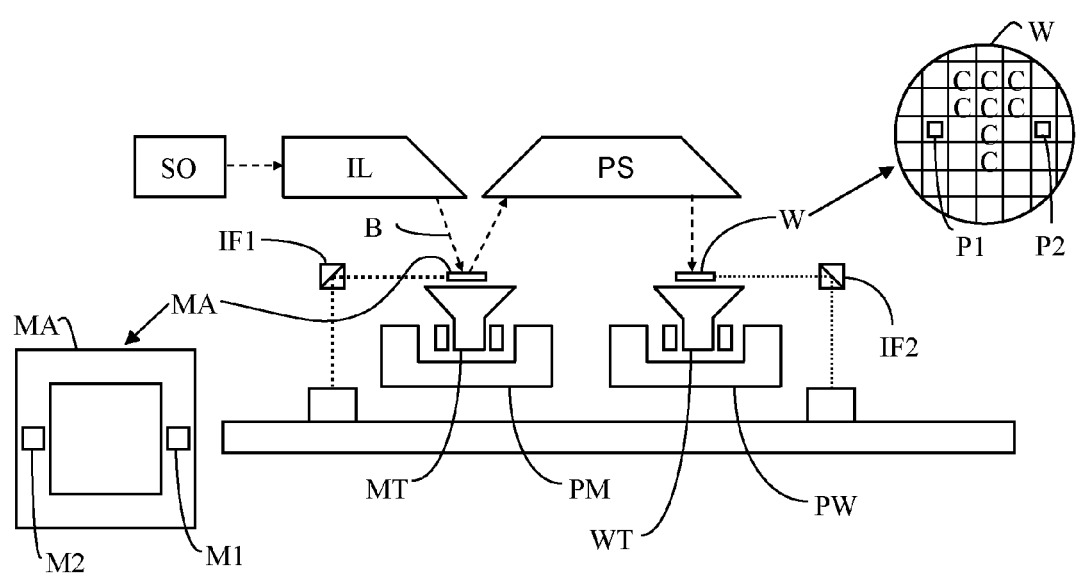
FIG. 1 schematically depicts a lithographic apparatus according to an embodiment of the invention.

FIG. 1 schematically depicts a lithographic apparatus according to one embodiment of the invention. The apparatus comprises: an illumination system (illuminator) IL configured to condition a radiation beam B of EUV radiation. It will be appreciated that the term 'EUV' radiation relates to any electromagnetic radiation having wavelength in the range of 6.7-20 nanometers. The apparatus also includes a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure supports, i.e. bears the weight of, the patterning device. It holds the patterning device in a manner that depends on the orientation of the patterning device, the design of the lithographic apparatus, and other conditions, such as for example whether or not the patterning device is held in a vacuum environment. The support structure can use mechanical, vacuum, electrostatic or other clamping techniques to hold the patterning device. The support structure may be a frame or a table, for example, which may be fixed or movable as required. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used. Any use of the term "projection lens" herein may be considered as synonymous with the more general term "projection system".

As here depicted, the apparatus is of a reflective type (e.g. employing a reflective mask).

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

Referring to FIG. 1, the illuminator IL receives a radiation beam from a radiation source SO. The source and the lithographic apparatus may be separate entities, for example when the source is a $CO_2$ laser. In such cases, the source is not considered to form part of the lithographic apparatus and the radiation beam is passed from the source SO to the illuminator IL with the aid of a beam delivery system comprising, for example, suitable directing mirrors and/or a beam expander. In other cases the source may be an integral part of the lithographic apparatus. The source SO and the illuminator IL, together with the beam delivery system if required, may be referred to as a radiation system.

The illuminator IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator and a condenser. The illuminator may be used to condition the radiation beam, to have a desired uniformity and intensity distribution in its cross-section.

The radiation beam B is incident on the patterning device (e.g., mask MA), which is held on the support structure (e.g., mask table MT), and is patterned by the patterning device. Having traversed the mask MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the mask MA with respect to the path of the radiation beam B, e.g. after mechanical retrieval from a mask library, or during a scan. In general, movement of the mask table MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the mask table MT may be connected to a short-stroke actuator only, or may be fixed. Mask MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the mask MA, the mask alignment marks may be located between the dies.

The depicted apparatus could be used in at least one of the following modes:

1. In step mode, the mask table MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the mask table MT and the substrate table WT are scanned synchronously while a pattern imparted to the radiation beam is projected onto a target portion C (i.e. a single dynamic exposure). The velocity and direction of the substrate table WT relative to the mask table MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the mask table MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
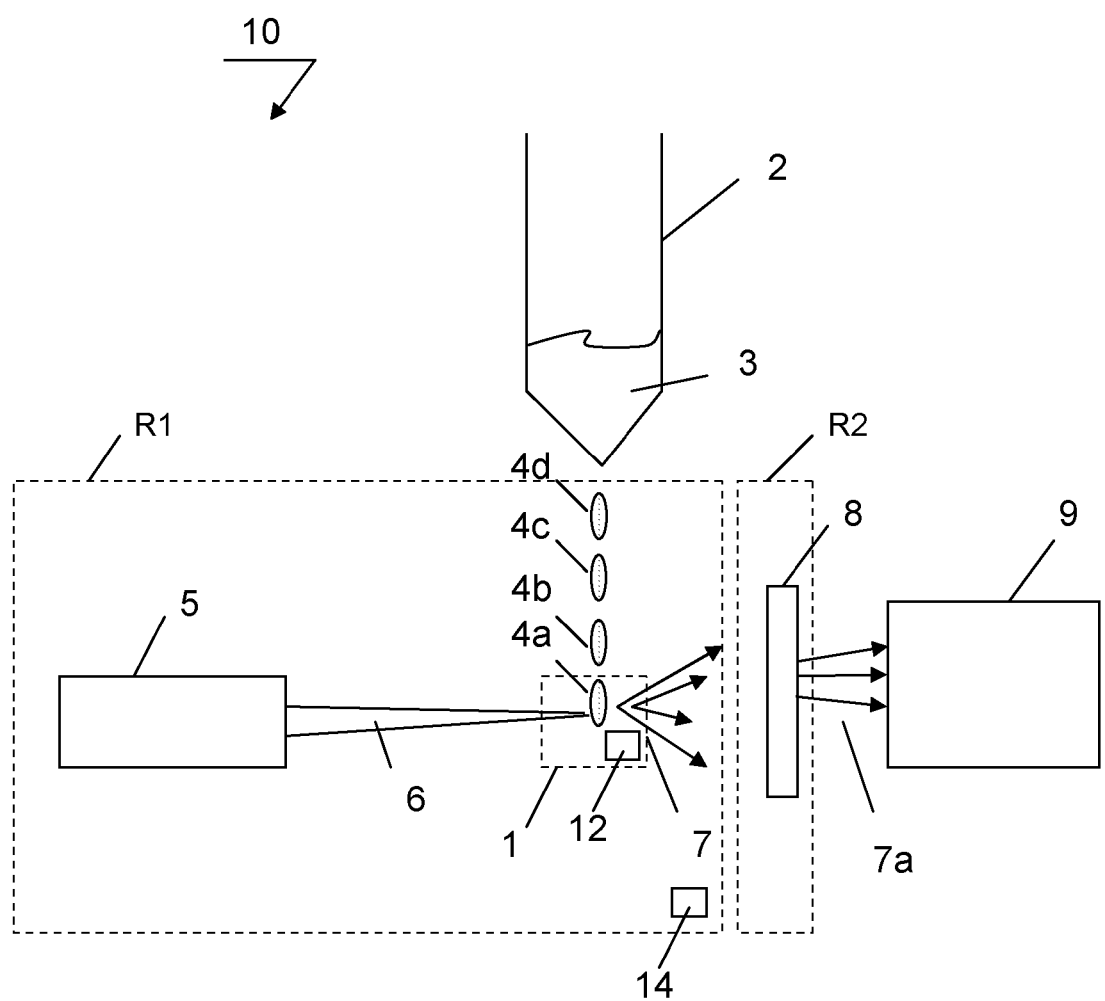
FIG. 2 schematically depicts a source module according to an embodiment of the invention.

FIG. 2 schematically depicts a source module according to an embodiment of the invention. The source module 10 may comprise a container 2 arranged with a liquefied target material 3, for example with Sn or Gd. The container 2 may be arranged with a suitable mechanism or opening (not shown) for delivery of liquid droplets 4a, 4b, 4c, 4d of Sn or Gd to the region 1 wherein a droplet is configured to be impinged by a laser beam 6 provided by a laser 5. The laser beam 6 may relate to a $CO_2$ laser having a wavelength of 10.6 micrometer. Alternatively, other suitable lasers may be used having respective wavelengths in the range of 1-11 micrometers. The laser light is desirably focused in the region 1 using a suitable optical system (not shown). Upon interaction with the laser beam the droplets 4a, 4b, 4c, 4d are transferred into plasma state which may emit a 6.7 nm radiation, or any other EUV radiation in the range of 5.0-20 nanometers.

The emanating EUV beam 7 may be intercepted by a suitable debris mitigation system 8 configured to collect or to deflect particle debris emanating from the region 1. The EUV beam 7a substantially free of debris may then enter the illumination system 9 of the lithographic apparatus configured to suitably condition the beam 7a.

In accordance with an aspect of the invention, the source module 10 may include a buffer gas for cooperating with a source of laser produced plasma. The buffer gas may have at least 50% transmission for the EUV radiation, and at least 70% absorption for the secondary radiation.

Desirably, the buffer gas has at least 90% or at least 95% transmission for the EUV radiation. It is further desirable that the buffer gas has at least 90% absorption for the secondary radiation.

In accordance with the aspect of the invention, n a gas may be provided in region 1 of the source module, which gas acts as a buffer gas intercepting debris and simultaneously acts as a spectral purity filter enabling a due EUV enrichment of the incoming beam 7, by simultaneously having a high EUV transmittance and having a high absorption the pump laser wavelength (typical wavelength 10.6 μm for a $CO_2$ laser). In an embodiment, the pressure integral of the gas may be 1 mbar·cm or higher. This is found to be sufficient to thermalize atomic and ionic debris and therefore to mitigate particulate debris propagating from the source. Desirably, a pressure integral of the buffer gas is set to a value in the range of 0.5-5 mbar·cm.

Suitable buffer gas is a gas having a light atomic weight elements and may be selected from a group consisting of: $C_2H_4$, $NH_3$, $O_3$, $CH_3OH$, $CO_2$, $CH_4$, $C_2H_6$, $C_2H_2$, and $NH_2D$. Further suitable gases which may be used for suppressing secondary radiation, like infra-red radiation, emanating from a $CO_2$ laser source are $SiH_3Cl$, $SiH_3F$, and $SiH_3Br$. It is found that sources constructed to emit 6.7 nm radiation are particularly suitable to be combined with such gases, because the EUV transmittance of such gases in the range of about 6.7 nm is relatively high (typically>95%) for a given suppression of unwanted wavelengths, like infra-red radiation. In this way a due EUV enrichment of the beam 7 is facilitated.

It will be appreciated that embodiments of the invention may be used for any type of EUV source, including but not limited to a discharge produced plasma source (DPP source), or a laser produced plasma source (LPP source). However, the invention may be particularly suited to suppress radiation from a laser source, which typically forms part of a laser produced plasma source. This is because a laser source has typically a small bandwidth and molecular absorption lines also typically have a limited bandwidth, unless a large number of absorption lines is available within a certain wavelength region. Thus, when radiation from a laser source is required to be suppressed the availability of suitable materials, desirably, gasses is much higher.

In an embodiment of the source module according to the invention, the buffer gas may include a mixture of a first gas specimen and a second gas specimen. The second specimen may be selected to, for example, pressure broaden absorption peaks of the main buffer gas. For example, when a buffer gas, like $C_2H_4$, $NH_3$, $NH_2D$, $O_3$, $CH_3OH$, $CO_2$, $CH_4$, $C_2H_6$, $C_2H_2$, $SiH_3Cl$, $SiH_3F$, or $SiH_3Br$ is suitably mixed or combined with a second gas, the second gas may not need to absorb infrared radiation, but the EUV transmittance of this second type of gas is desirably at least the same or higher than for the first gas specimen. An example of such combination is a mixture of $CO_2$ and He, where $CO_2$ is used to absorb infrared light, and He is used to pressure broaden the absorption lines of the $CO_2$. It is also possible to use a gas with a high absorption strength for the secondary radiation as a second gas species and a gas with a high EUV transmittance as a first gas species. Examples of such second gas species may include $H_2$, He, Ne or Ar.

At pressures of about ~1 mbar and higher, absorption lines will typically be pressure broadened to a few hundred MHz and even up to several GHz, thereby improving efficiency of the buffer gas. For comparison, a typical laser bandwidth of about 100 MHz is expected for a $CO_2$ pump laser in a laser produced plasma source.

It is also possible that the secondary radiation generated by the source comprises electromagnetic radiation having a plurality of substantially distinct wavelengths. In this case, the buffer gas may relate to a suitable mixture comprising a first gas specimen having at least 50% transmission to the EUV radiation, and a second gas specimen having at least 70% absorption for said plurality of wavelengths.

According to an embodiment of the invention, light of the laser 5 is configured to propagate through a first region R1 corresponding to a region wherein EUV is generated and a second region R2. The source module may include a pressure barrier 8 constructed to substantially confine the buffer gas to the second region R2.

Different embodiments of a suitable pressure barrier are contemplated, wherein the pressure barrier is constructed to maintain a higher (partial) pressure of the buffer gas in the second region R2, between the source and the collector, and a lower (partial) pressure of the buffer gas at the beam path of the pump laser in the first region R1. For example, the pressure barrier may relate to a tube that at least partly encloses the pump laser beam and has an opening that is small enough to enable differential pumping. In another example, a gas with a low absorption for infrared may be directed in a high-speed flow along the pump laser beam path. The pressure barrier may further relate to a foil trap or to a gas injected stationary foil trap. This particular embodiment will be discussed with reference to FIG. 3.

In accordance with an embodiment of the invention, the source module 10 may be constructed to cool the buffer gas. For example, the source module 10 may comprise a passive element 12 (see FIG. 2) for cooling the buffer gas, like a stationary or rotatable plate having a large area, for example a foil trap. Alternatively or additionally, the source module 10 may further comprise a circulation unit 14 (see FIG. 2) constructed to circulate the buffer gas for cooling of the buffer gas. The feature of cooling the buffer gas may be advantageous for maintaining efficiency of the buffer gas, as relative intensities of the absorption lines change with temperature. By maintaining the buffer gas at a suitable pre-selected operational temperature, overall performance of a lithographic apparatus that includes the source module 10 may not be compromised. In addition, cooling of the buffer gas may be advantageous, because an undesirable increase of the temperature thereof leads to a desire to maintain higher partial density of the buffer gas for achieving a substantially constant spectral purity filter and debris mitigation performance of the buffer gas. By avoiding an unnecessary increase of the partial density of the buffer gas, the operational specifications for suitable pumps may be relaxed.

Figure 3:
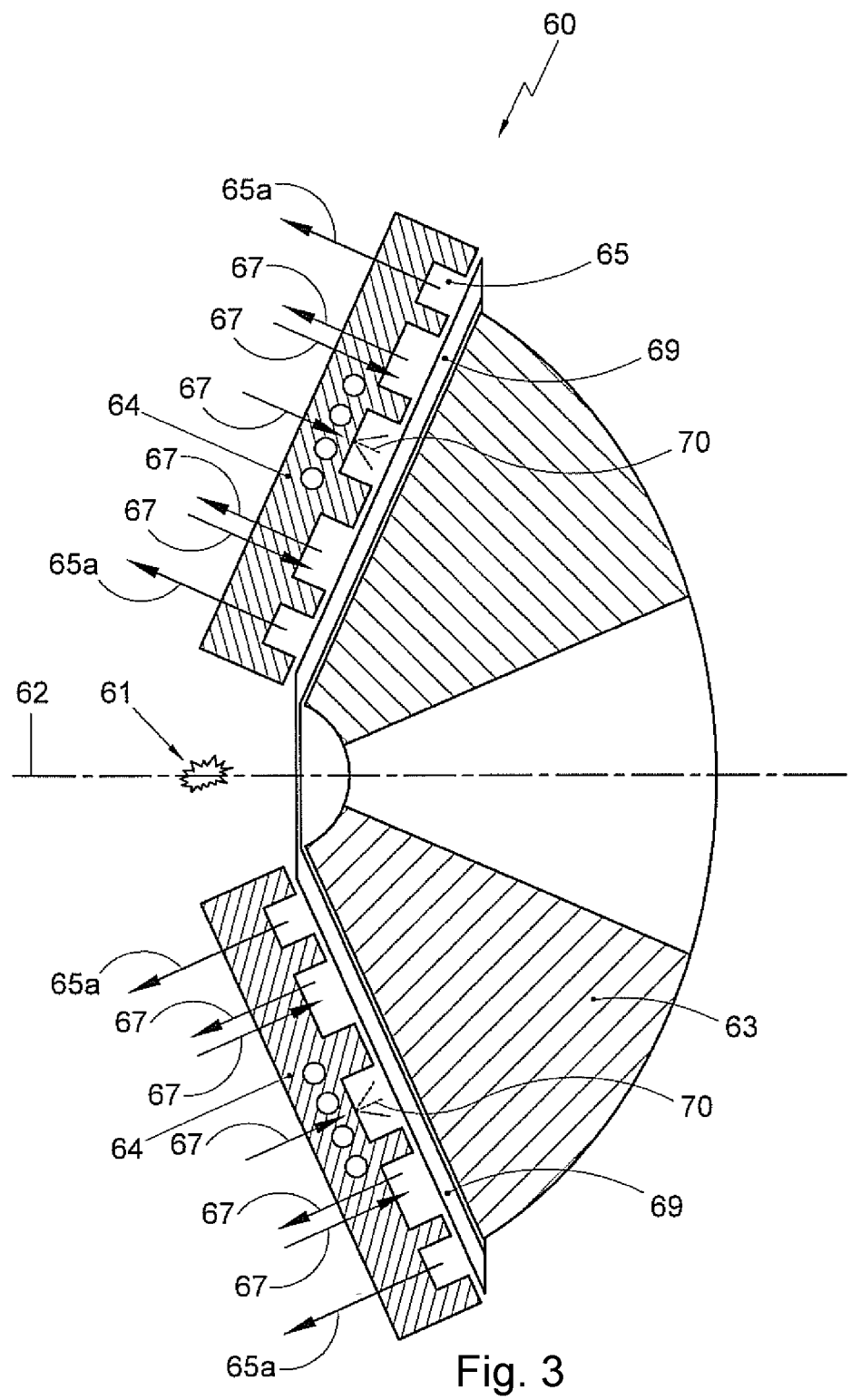
FIG. 3 schematically depicts a source module according to an embodiment of the invention.

FIG. 3 schematically depicts an embodiment of a portion of a source module according to an aspect of the invention, wherein a cross-section of an embodiment of a foil trap 60 provided with the buffer gas is depicted. The foil trap 60 may be arranged around an axis of rotation 62 near the source 61 of the EUV radiation, and may comprise a plurality of channel barriers 63 arranged for preventing material, i.e. particulate debris, like slow atomic debris, fast atomic debris, i.e. ions and/or micro-particles, from propagating inside the lithographic projection apparatus. The foil trap 60 may comprise a system 64 for retaining a buffer gas, arranged to provide the buffer gas substantially inside the channel barriers 63 for intercepting the particulate debris. The buffer gas may be supplied by a suitable plurality of conducts through which the buffer gas may flow inwardly and outwardly, as is schematically indicated by arrows 65a, 67. By arranging the buffer gas in a circulatory fashion, cooling of the buffer gas may also be enabled. A pump-down chamber 65 may be provided for supplying the buffer gas to a suitable exit port (not shown). In addition, a further port 70 may be provided for supplementing the buffer gas with a further gas, for example for causing a pressure induced broadening of suitable absorption lines of the buffer gas. The system 64 may further comprise a supplementary cooling system 69 for cooling the foil trap.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. The descriptions above are intended to be illustrative, not limiting. Thus, it will be apparent to one skilled in the art that modifications may be made to the invention as described without departing from the scope of the claims set out below.

What is claimed is:

1. A source module for use in a lithographic apparatus, the source module being constructed to generate extreme ultra violet (EUV) radiation and secondary radiation, the source module comprising a buffer gas configured to cooperate with a source of the EUV radiation, said buffer gas having at least 50% transmission for the EUV radiation, and at least 70% absorption for the secondary radiation.

2. A source module according to claim 1, wherein the buffer gas is selected from a group of: $C_2H_4$, $NH_3$, $O_3$, $CH_3OH$, $CO_2$, $CH_4$, $C_2H_6$, $C_2H_2$, $NH_2D$, $SiH_3Cl$, $SiH_3F$, and $SiH_3Br$.

3. A source module according to claim 1, wherein the buffer gas comprises a mixture of a first gas specimen and a second gas specimen.

4. A source module according to claim 3, wherein the second gas specimen is configured to broaden absorption lines of the first gas specimen.

5. A source module according to claim 4, wherein the first gas specimen is selected from a group of $C_2H_4$, $NH_3$, $O_3$, $CH_3OH$, $CO_2$, $CH_4$, $C_2H_6$, $C_2H_2$, $NH_2D$, $SiH_3Cl$, $SiH_3F$, and $SiH_3Br$, and a second gas specimen is selected from a group of $H_2$, He, Ne, and Ar.

6. A source module according to claim 1, wherein the secondary radiation has a wavelength in a range of about 1-11 micrometers.

7. A source module according to claim 3, wherein the secondary radiation comprises a plurality of wavelengths, the second gas specimen having at least 70% absorption for said plurality of wavelengths.

8. A source module according to claim 1, wherein a pressure integral of the buffer gas is in the range of 0.5-5 mbar·cm.

9. A source module according to claim 1, wherein light of a laser is configured to propagate through a first region and a second region, wherein a laser produced plasma is generated in the first region, the source module further comprising a pressure barrier configured to confine the buffer gas to the second region.

10. A source module according to claim 9, wherein the pressure barrier comprises a foil trap.

11. A source module according to claim 10, wherein the foil trap is a gas injected stationary foil trap.

12. A lithographic apparatus arranged to project a pattern from a patterning device onto a substrate, the lithographic apparatus comprising: a source module constructed to generate extreme ultra violet (EUV) radiation and secondary radiation, the source module comprising a buffer gas configured to cooperate with a source of the EUV radiation, said buffer gas having at least 50% transmission for the EUV radiation, and at least 70% absorption for the secondary radiation.

13. A device manufacturing method comprising:

generating extreme ultra violet (EUV) radiation and secondary radiation with a source module, the source module comprising a buffer gas configured to cooperate with a source of the EUV radiation, said buffer gas having at least 50% transmission for the EUV radiation, and at least 70% absorption for the secondary radiation; and projecting a patterned beam of the EUV radiation onto a substrate.

14. A device manufacturing method comprising:

generating extreme ultraviolet radiation and secondary radiation with a radiation source;

providing a buffer gas to the radiation source, the buffer gas having at least 50% transmission for the extreme ultraviolet radiation, and at least 70% absorption for the secondary radiation; and projecting a patterned beam of the extreme ultraviolet radiation onto a substrate.

* * * * *